(12) United States Patent
Matsuzawa et al.

(10) Patent No.: US 12,109,889 B2
(45) Date of Patent: Oct. 8, 2024

(54) OPERATION DEVICE

(71) Applicant: KABUSHIKI KAISHA TOKAI RIKA DENKI SEISAKUSHO, Aichi (JP)

(72) Inventors: Takahiko Matsuzawa, Aichi (JP); Terumasa Suyama, Aichi (JP)

(73) Assignee: KABUSHIKI KAISHA TOKAI RIKA DENKI SEISAKUSHO, Aichi (JP)

( * ) Notice: Subject to any disclaimer, the term of this patent is extended or adjusted under 35 U.S.C. 154(b) by 265 days.

(21) Appl. No.: 17/762,784

(22) PCT Filed: Sep. 14, 2020

(86) PCT No.: PCT/JP2020/034705
§ 371 (c)(1),
(2) Date: Mar. 23, 2022

(87) PCT Pub. No.: WO2021/060051
PCT Pub. Date: Apr. 1, 2021

(65) Prior Publication Data
US 2022/0371442 A1  Nov. 24, 2022

(30) Foreign Application Priority Data

Sep. 27, 2019 (JP) .................. 2019-176449
May 28, 2020 (JP) .................. 2020-093333

(51) Int. Cl.
*B60K 35/10* (2024.01)
*B60K 35/60* (2024.01)
(Continued)

(52) U.S. Cl.
CPC .............. *B60K 35/10* (2024.01); *B60K 35/60* (2024.01); *G06F 3/0412* (2013.01); *G06F 3/044* (2013.01);
(Continued)

(58) Field of Classification Search
CPC .......... B60H 1/00; B60K 35/10; B60K 35/60; B60K 2360/1434; B60K 2360/1446;
(Continued)

(56) References Cited

U.S. PATENT DOCUMENTS

2004/0117084 A1* 6/2004 Mercier ................. B60K 35/10
                                                                                 307/10.1
2020/0105482 A1   4/2020 Kosugi

FOREIGN PATENT DOCUMENTS

CN  101090039 A  12/2007
CN  108541331 A   9/2018
(Continued)

OTHER PUBLICATIONS

English Translation of the Written Opinion of the International Searching Authority, date Mar. 27, 2022, retrieved from WIPO website https://patentscope.wipo.int/search/en/detail.jsf?docId=WO2021060051 (Year: 2022).*

(Continued)

*Primary Examiner* — Calvin Cheung
(74) *Attorney, Agent, or Firm* — Tarolli, Sundheim, Covell & Tummino LLP

(57) ABSTRACT

An operation device includes an operation unit configured to be movable relative to a device body of the operation device. The operation device includes a first detector that detects touching of the operation unit and a second detector that detects movement of the operation unit relative to the device (Continued)

body. The operation device further includes a controller that processes detection signals of the first detector and the second detector so that the movement of the operation unit relative to the device body and the touching of the operation unit correspond to inputs for operating an operation subject apparatus.

7 Claims, 9 Drawing Sheets

(51) Int. Cl.
*G06F 3/041* (2006.01)
*G06F 3/044* (2006.01)
*H01H 13/64* (2006.01)
*H03K 17/96* (2006.01)

(52) U.S. Cl.
CPC ......... *H01H 13/64* (2013.01); *H03K 17/9622* (2013.01); *B60K 2360/1434* (2024.01); *B60K 2360/1446* (2024.01); *H03K 2217/960755* (2013.01)

(58) Field of Classification Search
CPC .............. B60K 35/29; B60K 2360/128; B60K 2360/131; B60K 2360/145; B60K 2360/199; G06F 3/0412; G06F 3/044; G06F 3/0416; H01H 13/64; H03K 17/9622; H03K 2217/960755; H03K 2217/96054

See application file for complete search history.

(56) References Cited

FOREIGN PATENT DOCUMENTS

| | | | |
|---|---|---|---|
| EP | 1859992 A1 * | 11/2007 | ........... B60Q 1/1484 |
| JP | 2003-098586 A | 4/2003 | |
| JP | 2007-317393 A | 12/2007 | |
| JP | 2012-53801 A | 3/2012 | |
| JP | 2014-125181 A | 7/2014 | |
| JP | 2014146487 A | 8/2014 | |
| JP | 2015011771 A | 1/2015 | |
| JP | 2016-81809 A | 5/2016 | |
| WO | 2017/122749 A1 | 7/2017 | |

OTHER PUBLICATIONS

KR 102049649 B1 with English translation; date filed Dec. 17, 2015; date published Nov. 27, 2019. (Year: 2019).*
WO 2017122749 A1 with English translation, filed date Jan. 12, 2017; date published Jul. 20, 2017. (Year: 2017).*
International Search Report and Written Opinion issued in connection with corresponding patent application No. PCT/JP2020/034705 dated Oct. 29, 2020.

* cited by examiner

OPERATION DEVICE

RELATED APPLICATIONS

The present invention is a U.S. National Stage under 35 USC 371 patent application, claiming priority to Serial No. PCT/JP2020/034705, filed on Sep. 14, 2020; which claims priority from Japanese Patent Application No. 2019-176449 filed on Sep. 27, 2019 and Japanese Patent Application No. 2020-093333 filed on May 28, 2020; the entireties of all are hereby incorporated herein by reference.

TECHNICAL FIELD

The present invention relates to an operation device that is operated to operate an apparatus.

BACKGROUND ART

A known vehicle includes an operation device in which, for example, switches are arranged to operate various types of onboard apparatuses (refer to, for example, Patent Document 1). Specifically, a group of switches for an air conditioner and a group of switches for an audio device or the like are arranged on a center console or the like inside the passenger compartment. The switches are of various types, for example, push switches, dial switches, lever switches, and the like.

Patent Document 1: Japanese Laid-Open Patent Publication No. 2014-125181

SUMMARY

A structure including an arrangement of switches allows for multiple input functionalities but requires a user to move his or her hand from one switch to another switch to operate different switches. This adversely affects the operability. Further, an increase in functionalities will require more switches and thus increases the quantity of components. Moreover, a structure including an arrangement of switches will require margins to be provided between the switches. This lowers the aesthetic appeal.

A touch panel may be used as an operation device. However, the user may find it difficult to operate the touch panel since he or she just touches the screen to perform touching. Further, smears such as fingerprints on the touch panel often become noticeable.

It is an objective of the present invention to provide an operation device with improved operability.

An operation device according to one embodiment includes an operation unit configured to be movable relative to a device body; a first detector that detects touching of the operation unit; a second detector that detects movement of the operation unit relative to the device body; and a controller that processes detection signals of the first detector and the second detector so that the movement of the operation unit relative to the device body and the touching of the operation unit correspond to inputs for operating an operation subject apparatus.

The operation device according to the present invention improves operability.

DESCRIPTION OF EMBODIMENTS

First Embodiment

An operation device 1 according to a first embodiment will now be described with reference to FIGS. 1 to 10.

Figure 1:
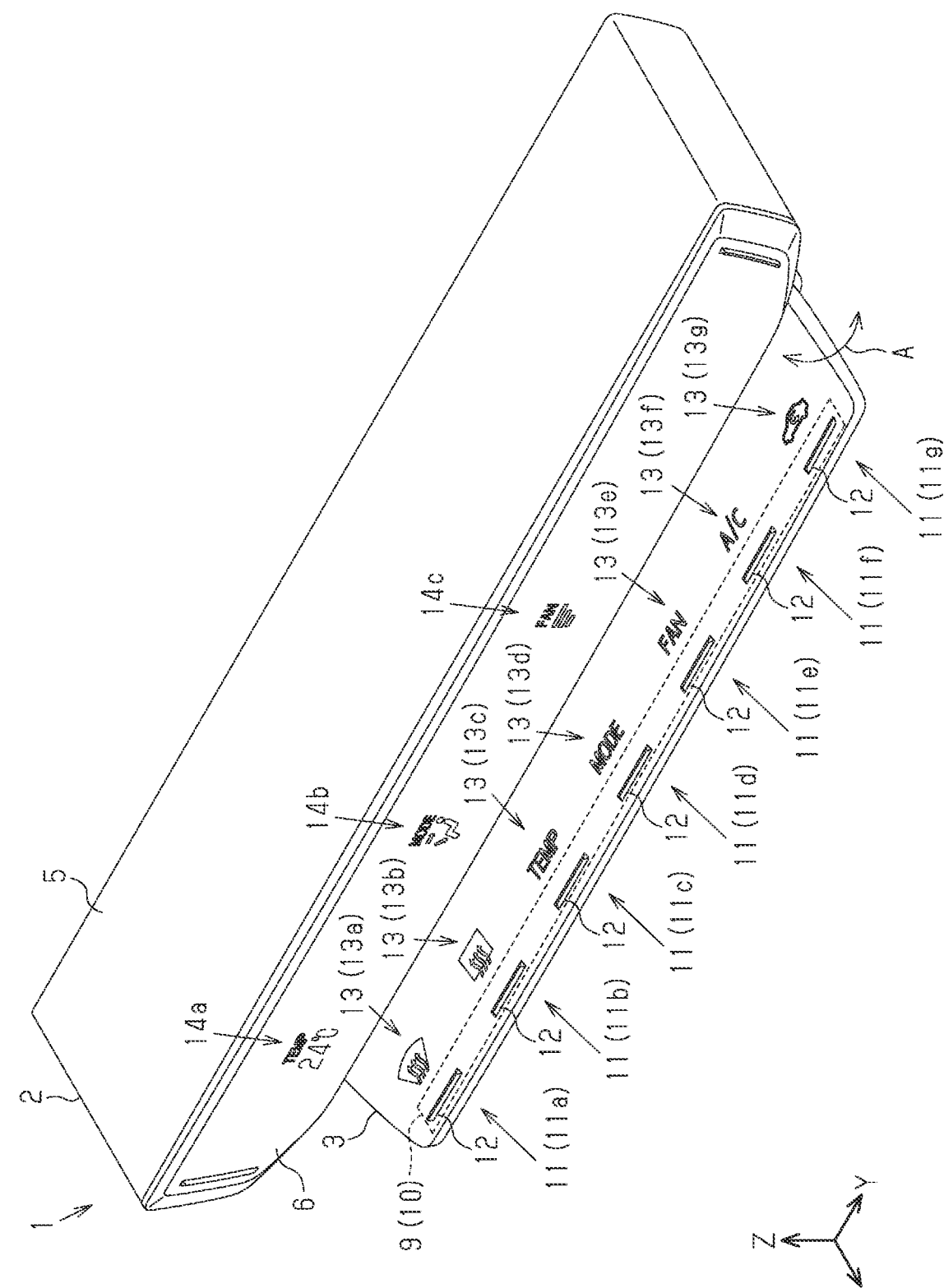
FIG. 1 is a perspective view illustrating a first side of an operation device according to a first embodiment.
Figure 2:
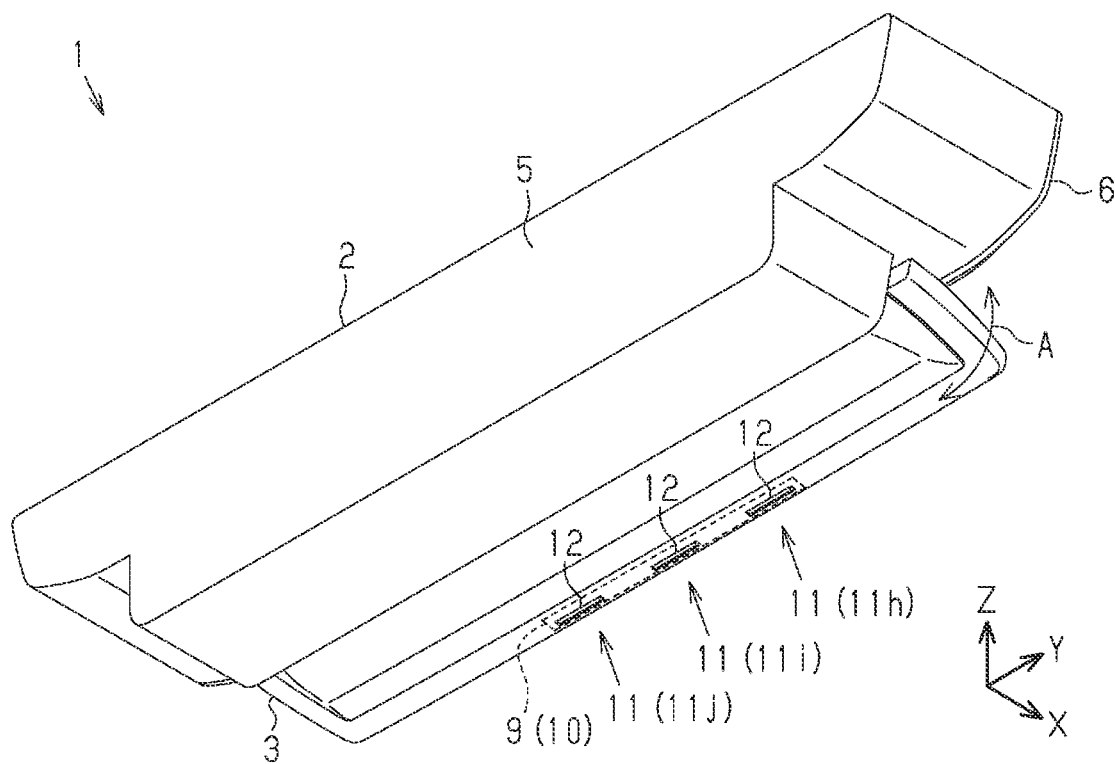
FIG. 2 is a perspective view illustrating a second side of the operation device.

As illustrated in FIGS. 1 and 2, the operation device 1 includes a device body 2 that forms a main body of the operation device 1 and an operation unit 3 that is operated by a user using the operation device 1. The operation device 1 is operated when a user operates, for example, an onboard apparatus 4 (refer to FIG. 5) in a desired mode. The onboard apparatus 4 is, for example, an air conditioner that air-conditions the passenger compartment. However, the onboard apparatus 4 is not limited to an air conditioner.

The device body 2 includes a housing 5 that forms the main portion of the device body 2 and a display unit 6 arranged on the front face of the housing 5. The housing 5 has a substantially rectangular parallelepiped shape that is elongated in the device width direction of the operation device 1 (Y-axis direction of FIGS. 1 and 2). The display unit 6 includes, for example, a liquid crystal screen, and covers the entire front face of the housing 5. The display unit 6 displays the current state of the apparatus 4 that is selected and operated with the operation device 1.

The operation unit 3 is plate-like and elongated in the device width direction of the operation device 1 (Y-axis direction of FIGS. 1 and 2). The operation unit 3 is configured to be movable relative to the device body 2 in the thickness direction (arrow A direction in FIGS. 1 and 2).

The operation unit 3 includes a panel on which a first detector 9 is arranged to detect touching of the operation unit 3. The first detector 9 may include, for example, a capacitive sensor 10. In the present example, the first detector 9 is a capacitive touch panel arranged near the distal end of the panel of the operation unit 3 over the entire panel in the elongated direction. Operation buttons 11 are arranged on the panel of the operation unit 3 in correspondence with operation portions (coordinates on touch panel) where touching is performed. That is, various operation buttons 11, which serve as functionalities that are selectable with the operation device 1, are arranged on the panel of the operation unit 3. In this manner, the operation buttons 11 of the present example are touch-sensitive buttons that are selected by touching predetermined positions (predetermined coordinates) on the panel of the operation unit 3.

The operation buttons 11 are arranged on the panel of the plate-like operation unit 3. In the present example, the operation buttons 11 are arranged at equal intervals in the longitudinal direction of the operation unit 3 (Y-axis direction of FIGS. 1 and 2). The operation buttons 11 are formed on two sides of the panel of the operation unit 3. In this case, the first detector 9, that is, the capacitive touch panel, is preferably formed on each of the two sides of the operation unit 3. In the present example, seven operation buttons 11 are formed on a first side of the panel of the operation unit 3, and three operation buttons 11 are formed on a second side of the panel of the operation unit 3.

In the present example, the operation buttons 11 on first side of the panel of the operation unit 3 include, from the left in FIG. 1, an operation button 11a for defogging the windshield, an operation button 11b for defogging the back door glass, an operation button 11c for selecting the air conditioning temperature (temperature decreasing), an operation button 11d for selecting the air conditioning mode (e.g., shifting modes in first direction), an operation button 11e for adjusting air flow (decreasing flow), an operation button 11f for switching on or off a cooling function (dehumidification function), and an operation button 11g for switching between air recirculation and fresh air. A guide 12 projects from the first side of the panel of the operation unit 3 in correspondence with each operation button 11 on the first side of the panel.

The operation buttons 11 on the second side of the panel of the operation unit 3 include, from the right in FIG. 2, an operation button 11h for selecting the air conditioning temperature (temperature increasing), an operation button 11i for selecting the air conditioning mode (e.g., shifting modes in second direction), and an operation button 11j for adjusting air flow (increasing flow). A guide 12 projects from the second side of the panel of the operation unit 3 in correspondence with each operation button 11 on the second side of the panel.

The operation unit 3 includes marks 13 assigned to the touch-sensitive operation buttons 11. The marks 13 are, for example, printed onto the panel of the operation unit 3. The marks 13 of the present example include a mark 13a for the operation button 11a, a mark 13b for the operation button 11b, a mark 13c for the set of the operation buttons 11c and 11h, a mark 13d for the set of the operation buttons 11d and 11i, a mark 13e for the set of the operation buttons 11e and 11j, a mark 13f for the operation button 11f, and a mark 13g for the operation button 11g.

Referring to FIG. 1, the display unit 6 displays the current state selected by operating the operation unit 3. In the example illustrated in FIG. 1, the display unit 6 displays the current state of selection with an indication 14a that is set when a selection is made with the operation buttons 11c and 11h used to select the air conditioning temperature, an indication 14b that is set when a selection is made with the operation buttons 11d and 11i used to select an the conditioning mode, and an indication 14c that is set when a selection is made with the operation buttons 11e and 11j used to select the air flow.

Figure 3:
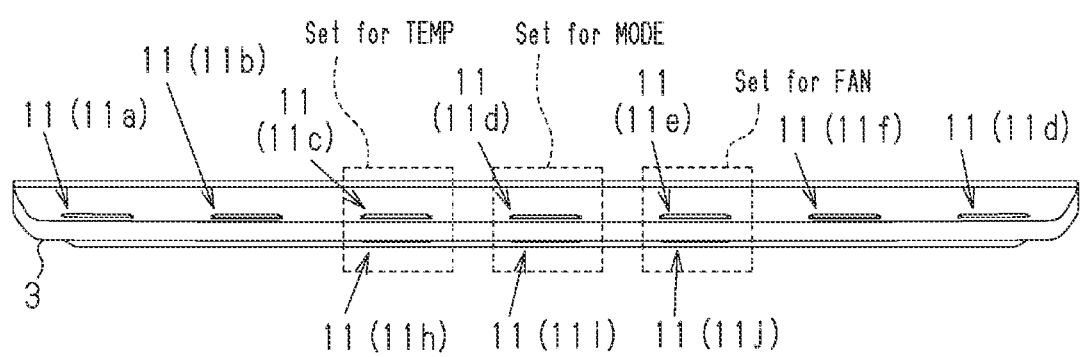
FIG. 3 is a front view of an operation unit.

As illustrated in FIG. 3, the opposing operation buttons 11 of the first detectors 9 on the first and second sides of the panel of the operation unit 3 are assigned for operation of the same functionality. In the present example illustrated in FIG. 3, the set of the operation buttons 11c and 11h arranged on the left is assigned to select the air conditioning temperature, the set of the operation buttons 11d and 11i arranged at the center is assigned to select the air conditioning mode, and the set of the operation buttons 11e and 11j arranged on the right is assigned to select the air flow.

Figure 4:
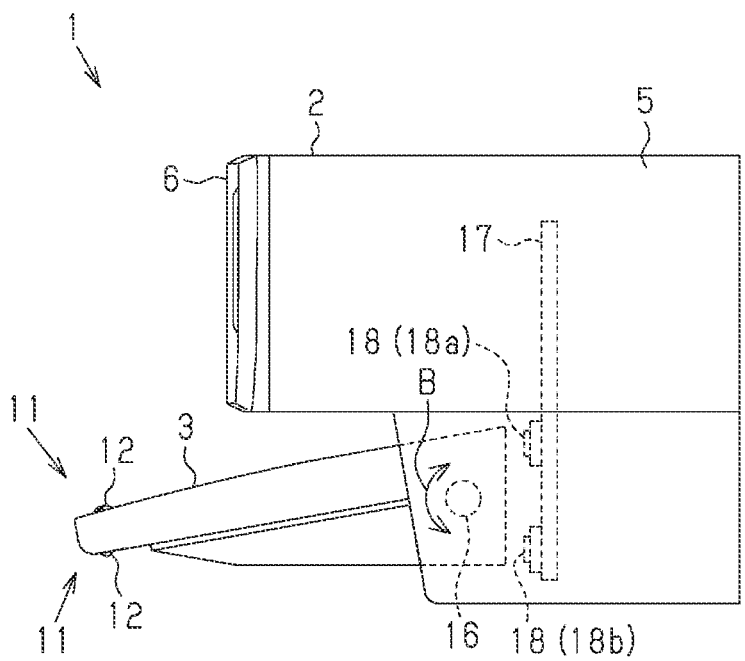
FIG. 4 is a side view of the operation device.

As illustrated in FIG. 4, a shaft 16 formed on the proximal end of the operation unit 3 supports the operation unit 3 pivotally on the device body 2. The operation unit 3 is movable about the shaft 16 (in arrow B direction of FIG. 4) by one step in each of two directions (upward direction or downward direction) from a neutral position (illustrated by solid lines in FIG. 4). The operation unit 3 of the present example is a momentary switch that returns to the neutral position when released after being moved upward or downward from the neutral position.

The device body 2 includes a base 17 on which various types of electric components of the operation device 1 are mounted. The base 17 of the present example is arranged vertically inside the device body 2. The base 17 includes a second detector 18 that detects movement of the operation unit 3 relative to the device body 2. The second detector 18 of the present example includes two tactile switches aligned vertically on the base 17. An upper second detector 18a detects upward pivoting about the shaft 16, and a lower second detector 18b detects downward pivoting about the shaft 16. The tactile switches of the second detectors 18a and 18b may have any structure (details are not illustrated in FIG. 4). For example, when the operation unit 3 is moved upward, the tactile switch of the second detector 18a is pushed ON by the operation unit 3. In the same manner, when the operation unit 3 is moved downward, the tactile switch of the second detector 18b is pushed ON by the operation unit 3.

The upward and downward movement of the operation unit 3 about the shaft 16 correspond to operations that determine the functionality selected with the operation buttons 11. In the present example, for each set of the opposing operation buttons 11 on the first and second sides of the panel for the same functionality (air conditioning temperature selection, air conditioning mode selection, or air flow selection), upward movement of the operation unit 3 about the shaft 16 corresponds to an operation for increasing the functionality by one step, and downward movement of the operation unit 3 about the shaft 16 corresponds to an operation for decreasing the functionality by one step. Further, for the operation buttons 11 arranged only on the first side of the panel (windshield defogging, back door glass defogging, cooling function (dehumidification function), and air recirculation or fresh air), downward movement of the operation unit 3 about the shaft 16 corresponds to a determination operation.

Figure 5:
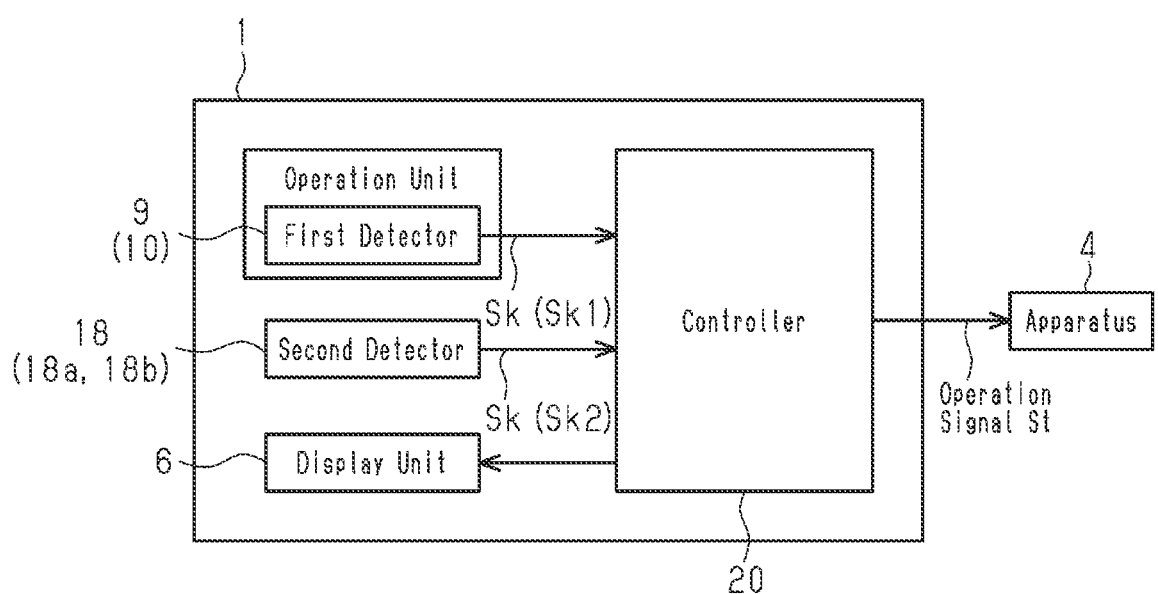
FIG. 5 is an electric diagram of the operation device.

As illustrated in FIG. 5, the operation device 1 includes a controller 20 that controls the operation of the operation device 1. The controller 20 processes detection signals Sk (first detection signal Sk1 and second detection signal Sk2) of the first detector 9 and the second detector 18 so that movement of the operation unit 3 relative to the device body 2 and touching of the operation unit 3 are recognized as inputs for operating the apparatus 4. The controller 20 determines the coordinate position of touching of the panel of the operation unit 3 from the first detection signal Sk1 to recognize the operation button 11 touched by the user. When the controller 20, which has recognized the touched operation button 11, detects upward movement or downward movement of the operation unit 3 from the second detection signal Sk2, the controller 20 outputs an operation signal St based on the series of operations to an electronic control unit (ECU) or the like of the apparatus 4. The controller 20 controls the display state of the display unit 6 based on the recognized operation state of the operation unit 3.

The operation of the operation device 1 in the present embodiment will now be described with reference to FIGS. 6 to 10.

Figure 6B:
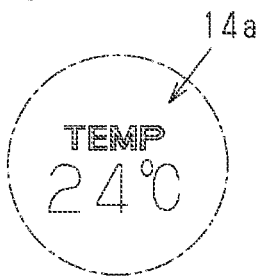
FIG. 6B is an enlarged view of the encircled portion.
Figure 6A:
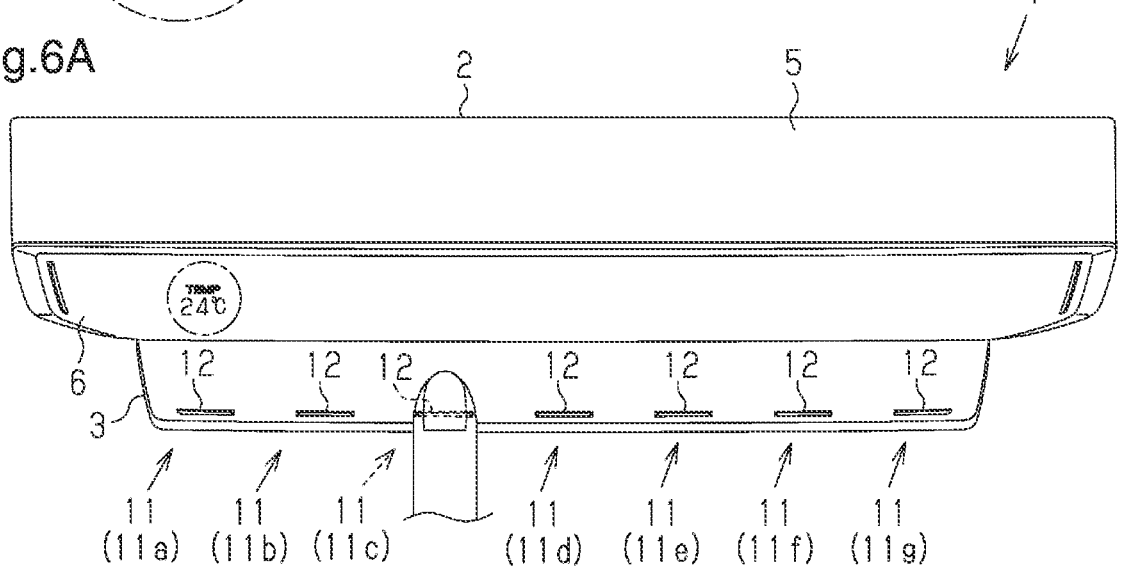
FIG. 6A is a diagram illustrating a state when an operation button for selecting the air conditioning temperature (decrease in temperature) is touched.

As illustrated in FIGS. 6A and 6B, the display unit 6 of the operation device 1 displays the current air conditioning temperature set by operating the operation device 1. In FIGS. 6A and 6B, the air conditioning temperature has been set to 24° C., and the display unit 6 displays "TEMP 24° C." To adjust the air conditioning temperature with the operation device 1, the user touches one of the operation buttons 11c and 11h and selects the air conditioning temperature. In the present example, to lower the air conditioning temperature, the operation button 11c for selecting the air conditioning temperature (decrease in temperature) is touched. To raise the temperature, the operation button 11h for selecting the air conditioning temperature (increase in temperature) is touched from below.

Figure 7:
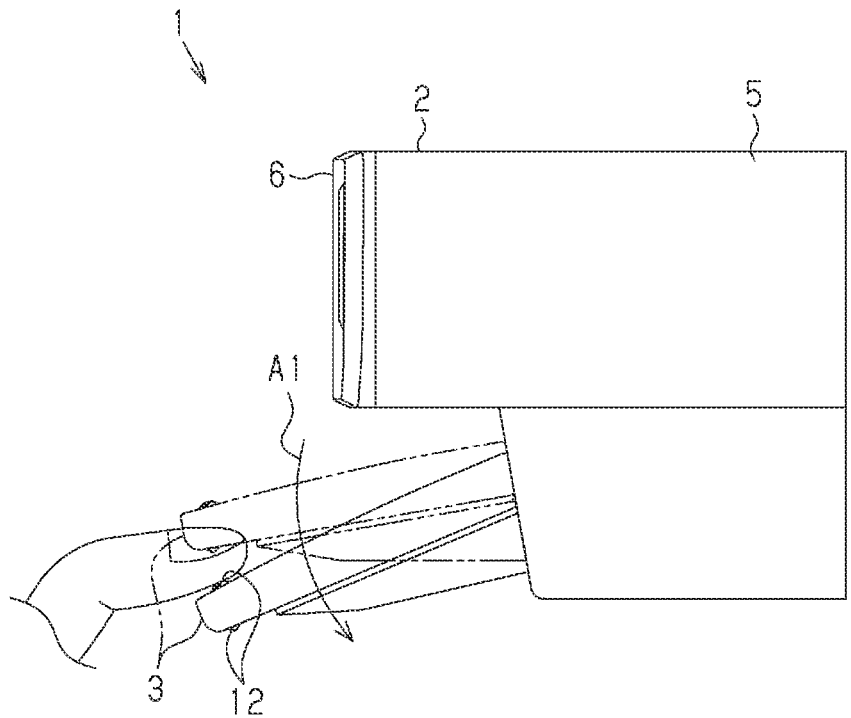
FIG. 7 is a diagram illustrating the operation unit pushed downward.

As illustrated in FIGS. 6A and 7, to lower the air conditioning temperature of the passenger compartment, the user touching the operation button 11c for selecting the air conditioning temperature (decrease in temperature) pushes the operation unit 3 downward (downward by one step) to pivot the operation unit 3 downward about the shaft 16 (arrow A1 direction of FIG. 7). In this manner, the touching of the operation button 11c for selecting the air conditioning temperature (decrease in temperature) corresponds to an operation for selecting the temperature. In the touching state, the downward pushing of the operation unit 3 by one step about the shaft 16 corresponds to a determination operation. The downward movement of the operation unit 3 about the shaft 16 is detected by the second detector 18b on the base 17.

When the first detector 9 detects touching of the operation button 11c for selecting the air conditioning temperature (decrease in temperature) and the second detector 18b detects downward pivoting of the operation unit 3 about the shaft 16, the controller 20 outputs an operation signal St indicating such a situation to the air conditioner. This lowers the selected air conditioning temperature by one step from the current state.

The controller 20 also changes the indication 14a (refer to FIG. 6B) of the current air conditioning on the display unit 6 to the changed temperature. Specifically, in a case where a determination operation is performed once with the operation unit 3 to lower the set temperature by 1° C., when the operation unit 3 detects that an operation to lower the temperature is performed one time, the controller 20 changes the indication 14a of the display unit 6 from 24° C. to 23° C. by lowering the currently set temperature by 1° C.

Figure 8:
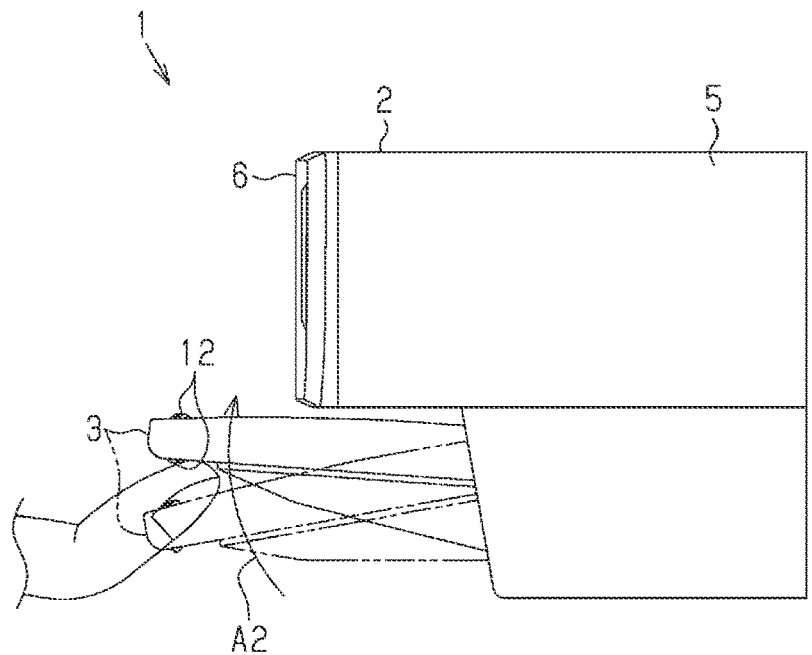
FIG. 8 is a diagram illustrating the operation unit pushed upward.

As illustrated in FIGS. 6A and 8, to raise the air conditioning temperature of the passenger compartment, the user touches the operation button 11h for selecting the air conditioning temperature (increase in temperature) and pushes the operation unit 3 upward (upward by one step) with his or her finger to pivot the operation unit 3 upward about the shaft 16 (arrow A2 direction of FIG. 8). In this manner, the touching of the operation button 11h for selecting the air conditioning temperature (increase in temperature) corresponds to an operation for selecting the temperature, and the upward pushing of the operation unit 3 from this state by one step about the shaft 16 corresponds to a determination operation. The upward movement of the operation unit 3 about the shaft 16 is detected by the second detector 18a on the base 17.

When the first detector 9 detects touching of the operation button 11h for selecting the air conditioning temperature (temperature increasing) and the second detector 18a detects upward pivoting of the operation unit 3 about the shaft 16, the controller 20 outputs an operation signal St indicating such a situation to the air conditioner. This raises the selected air conditioning temperature by one step from the current state.

The controller 20 also changes the indication 14a (refer to FIG. 6B) of the current air conditioning on the display unit 6 to the changed temperature. Specifically, in a case where a determination operation is performed once with the operation unit 3 to raise the set temperature by 1° C., when the operation unit 3 detects that an operation to raise the temperature is performed one time, the controller 20 changes the indication 14a of the display unit 6 from 24° C. to 25° C. by raising the currently set temperature by 1° C.

Figure 9B:
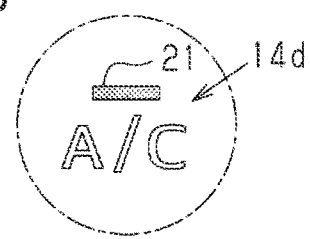
FIG. 9B is an enlarged view of the encircled portion.
Figure 9A:
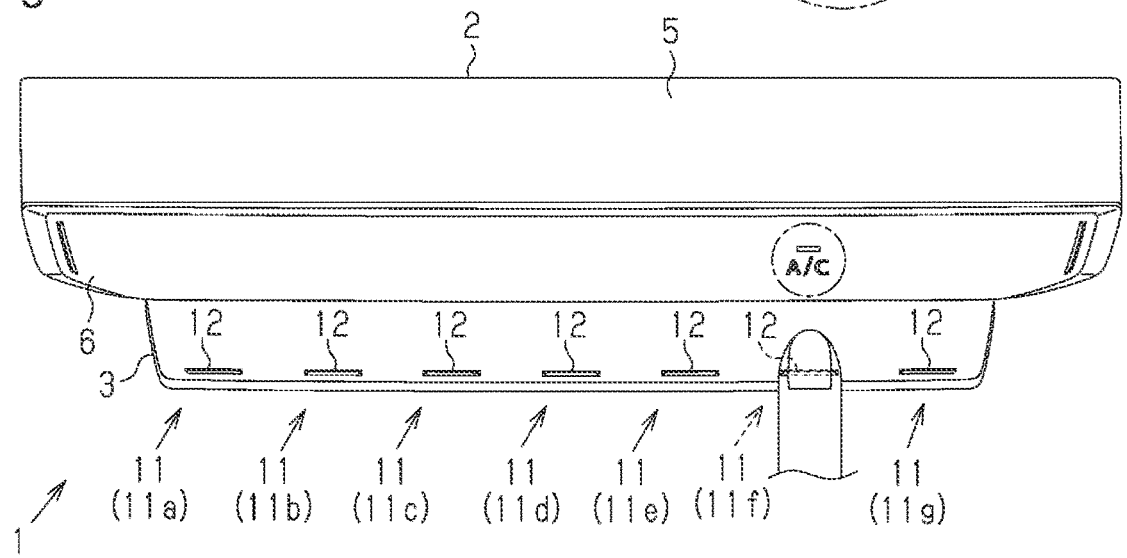
FIG. 9A is a diagram illustrating a state when an operation button for a cooling function (dehumidification function) is touched.

As illustrated in FIGS. 9A and 9B, to operate, for example, the operation button 11f for switching on or off the cooling function (dehumidification function), the user touches the operation button 11f and pushes the operation unit 3 downward to pivot the operation unit 3 downward about the shaft 16. In this manner, the touching of the operation button 11f for switching on or off the cooling function (dehumidification function) corresponds to an operation for selecting the on/off of the cooling function, and the downward pushing of the operation unit 3 from this state by one step about the shaft 16 corresponds to a determination operation.

When the first detector 9 detects touching of the operation button 11f for switching on or off the cooling function (dehumidification function) and the second detector 18b detects downward pivoting of the operation unit 3 about the shaft 16, the controller 20 outputs an operation signal St indicating such a situation to the air conditioner. This switches on or off the cooling function (dehumidification function) of the air conditioner. Further, the controller 20 changes an indication 14d of the cooling function (dehumidification function) showing whether the current state is on or off on the display unit 6. For example, when the cooling function (dehumidification function) is switched on, an indicator 21 above the character display of A/C is illuminated.

Figure 10:
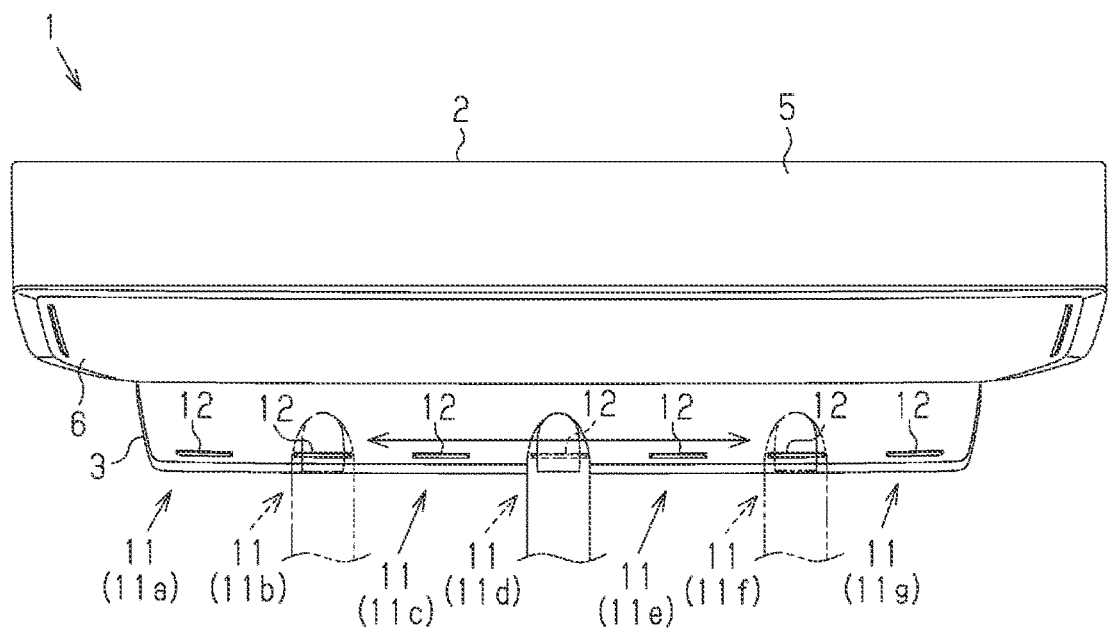
FIG. 10 is a diagram illustrating a state when a sliding operation is performed on a panel of the operation unit.

As illustrated in FIG. 10, with the operation unit 3 of the present example, plural operation buttons 11 are arranged on the plate-like panel so that the user can switch a selected state by sliding a finger on the panel in the right direction or the left direction. Thus, when switching from one operation button 11 to another operation button 11, the user slides the finger while continuously touching the operation unit 3 to the desired operation button 11. This allows for switching of operation buttons 11 without having to change switches or knobs.

The operation device 1 in the above embodiment has the following advantages.

(1) The operation device 1 includes the operation unit 3 is configured to be movable relative to the device body 2, the first detector 9 that detects touching of the operation unit 3, and the second detector 18 that detects movement of the operation unit 3 relative to the device body 2. The controller 20 of the operation unit 3 processes detection signals Sk of the first detector 9 and the second detector 18 so that movement of the operation unit 3 relative to the device body 2 and touching of the operation unit 3 are recognized as inputs for operating the apparatus 4 (operation subject apparatus).

The configuration of the present example allows for switching of the selected operation state of the apparatus 4 through movement of the operation unit 3 and touching of the operation unit 3. In the present example, an input for operating the apparatus 4 (operation subject apparatus) is a continuous two-step operation including touching (selection operation in present example) of the operation unit 3 and movement of the operation unit 3 (determination operation in present example). Thus, switches, knobs, or the like do not have to be switched to change the operation state of the apparatus 4. This improves operability.

(2) The operation unit 3 is plate-like. The touch-sensitive operation buttons 11 assigned to plural portions of the operation unit 3 are arranged in the longitudinal direction of the operation unit 3. Thus, the plate-like operation unit 3 is large enough to allow operations to be performed on the operation unit. This further improves operability. When switching the selected state through operation of the touch-sensitive operation buttons 11 arranged on the operation unit 3, the user can slide his or her finger on the panel of the plate-like operation unit 3 to operate the operation buttons 11. Thus, switches, knobs, or the like do not have to be switched to select operation buttons 11.

(3) The plate-like operation unit 3 is configured to be movable relative to the device body 2 in the thickness direction (substantially Z-axis direction of FIGS. 1 and 2). The second detector 18 detects movement of the operation unit 3 in the thickness direction. In this case, one of the touch-sensitive functionalities arranged at plural portions of the plate-like operation unit 3 can be selected, and the plate-like operation unit 3 can then be pushed downward or upward. Thus, the series of operations from selection to determination may be performed as a continuous operation. This provides improved operability.

(4) The operation unit 3 is moveable by one step in each of two directions from the neutral position. This increments the selected state when, for example, the operation unit 3 is moved by one step in one direction from the neutral position, and decrements when the operation unit 3 is moved by one step in the other direction from the neutral position. This operation is easy to understand and further provides improved operability.

(5) The first detector 9 is arranged on each of the first side and the second side of the operation unit 3. Thus, the multiple operation buttons 11 and the functionality may be assigned to a limited area on the operation unit 3.

(6) The touch-sensitive operation buttons 11 are assigned to plural portions on the first side and the second side of the operation unit 3. Functionality of the same type is assigned to the opposed operation buttons 11 on the first and second sides of the operation unit 3. Thus, the set of operation buttons 11 for the same functionality are arranged close to each other. This further improves operability.

(7) The operation unit 3 includes the marks 13 for the touch-sensitive operation buttons 11 assigned to plural portions. Thus, the marks 13 on the operation unit 3 allow for immediate recognition of the functionality assigned to each operation buttons 11.

(8) The operation device 1 includes the display unit 6 that displays the current state selected through operation of the operation unit 3. Thus, selection (determination) of the current operation is easily recognized from the display state of the display unit 6. The operation device 1 may be configured as a unit that is integrated with the display unit 6.

Second Embodiment

A second embodiment will now be described with reference to FIGS. 11 to 16. The second embodiment is an example in which the operation unit 3 and its peripheral structure are modified. Thus, the same reference numerals are given to those components that are the same as the corresponding components of the first embodiment and detailed explanations are omitted so that only the different parts will be described in detail.

Figure 11:
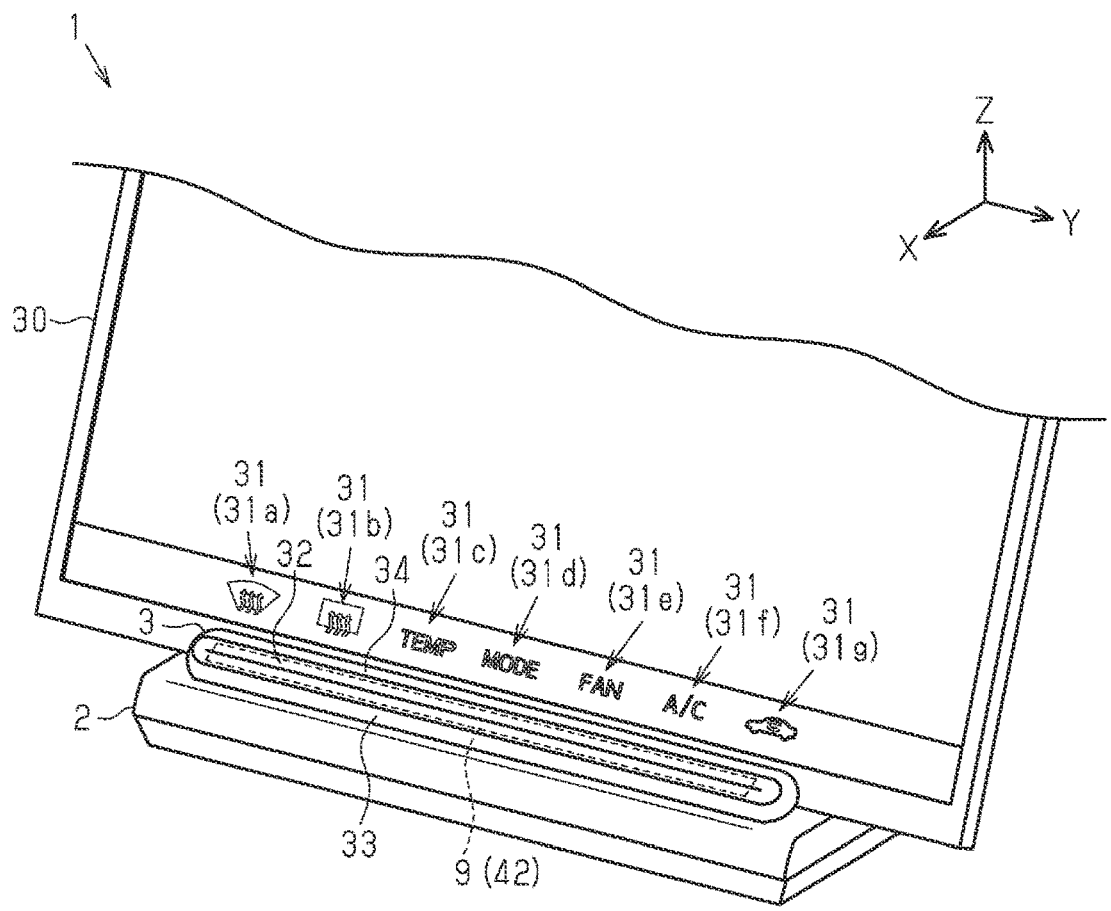
FIG. 11 is a perspective view illustrating the operation device according to a second embodiment.
Figure 13:
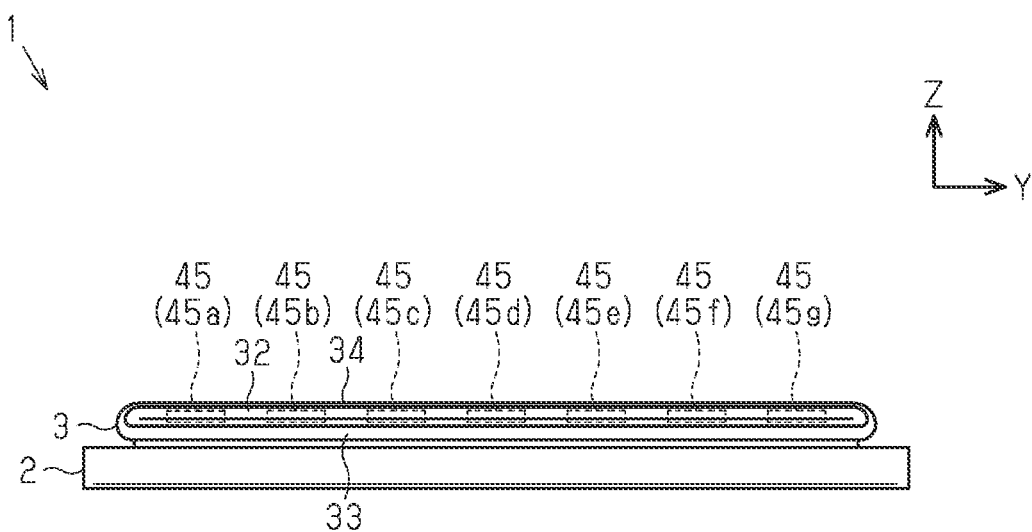
FIG. 13 is a front view of the operation unit.

As illustrated in FIGS. 11 and 13, the operation device 1 includes the device body 2 that forms the main body of the operation device 1, the operation unit 3 that is operated by the user using the device body 2, and a monitor 30 that displays a screen (image) in accordance with operation of the operation unit 3. The device body 2 has a substantially rectangular parallelepiped shape that is elongated in the device width direction (Y-axis direction of FIG. 11). The operation device 1 is operated when the user operates, for example, the onboard apparatus 4 in a desired mode. The apparatus 4 has, for example, part of functionality of an air conditioner for the passenger compartment (for example, air conditioning temperature selection switch). However, the apparatus 4 is not limited to the part of functionality of the air conditioner.

The monitor 30 displays icons 31 as the marks 13 of the functionalities selected with the operation unit 3. The icons 31 of the present example include, for example, an icon 31a for defogging the windshield, an icon 31b for defogging the back door glass, an icon 31c for air conditioning temperature, an icon 31d for selecting the air conditioning mode, an icon 31e for adjusting air flow, an icon 31f for switching on or off a cooling function (dehumidification function), and an icon 13g for switching between air recirculation and fresh air. In this manner, the monitor 30 displays the current state of the apparatus 4 that is selected and operated through the operation device 1 (operation unit 3).

Figure 14:
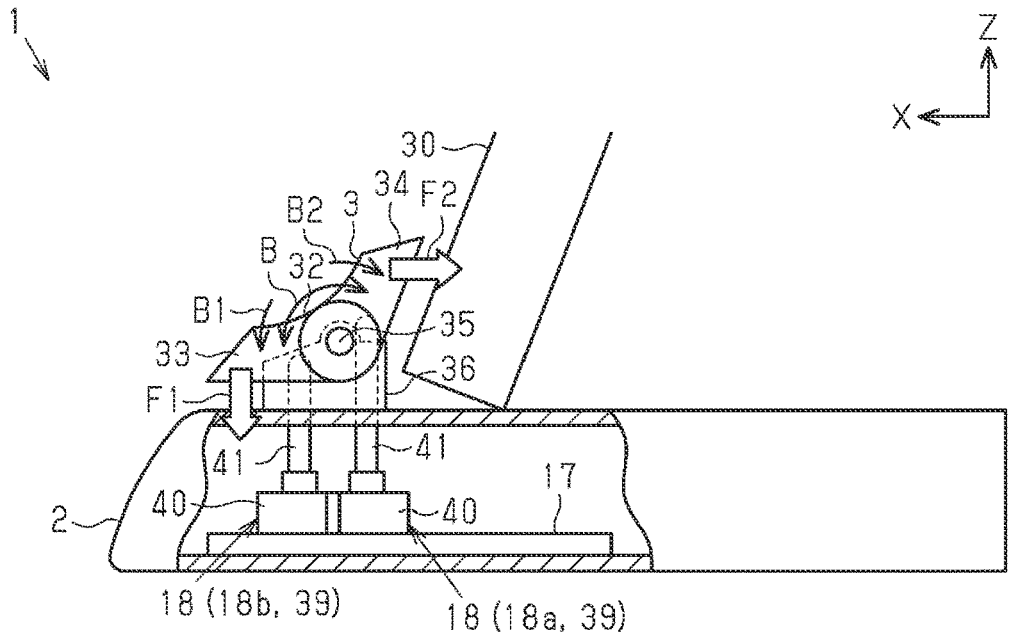
FIG. 14 is a partially cross-sectional view of the operation device.

As illustrated in FIG. 14, the operation unit 3 is elongated in the device width direction (Y-axis direction of FIG. 14) of the operation device 1 and has a substantially L-shaped cross section. The panel of the operation unit 3 of the present example is curved to conform to the shape of the finger of the user. The operation unit 3 of the present example is movable in a first direction (hereafter referred to as F1) or a second direction (hereafter referred to as F2) from a neutral position by the user touching the operation unit 3 at the neutral position. Specifically, the operation unit 3 includes a finger resting portion 32, a first push portion 33, and a second push portion 34. The finger resting portion 32 is recessed in conformance with the finger of an operator. The first push portion 33, which is defined by the arrangement of the finger resting portion 32, is located toward the user from the finger resting portion 32 on the panel of the operation unit 3. The second push portion 34, which is defined by the arrangement of the finger resting portion 32, is located away from the finger resting portion 32 on the panel of the operation unit 3.

The operation unit 3 is pivotally supported by a seat 36 of the device body 2 in a rotatable manner about a shaft 35 (in arrow B direction of FIG. 14) extending in the device width direction (Y-axis direction of FIG. 14). The operation unit 3 can be moved by one step in each of two directions (first direction F1 or second direction F2) from the neutral position. The operation unit 3 is a momentary switch that automatically returns to the neutral when released after being operated in either direction from the neutral position.

The device body 2 includes second detectors 18 that detect an operation of the operation unit 3 about the shaft 35. The second detectors 18 include a second detector 18a that detects an operation of the operation unit 3 in one of the first direction F1 and the second direction F2 and a second detector 18b that detects an operation of the operation unit 3 in the other one of the first direction F1 and the second direction F2. The second detector 18a and the second detector 18b are arranged next to each other in the depth direction of the device body 2 (X-axis direction of FIG. 14). The second detectors 18 of the present example include tactile switches 39 mounted on the base 17 accommodated in the device body 2. The tactile switches 39 each include a switch body 40 and a push rod 41 that switches on or off a contact point inside the switch body 40. When the push rod 41 is pushed and lowered by the operation unit 3, the contact point inside the switch body 40 is switched on.

Rotation of the operation unit 3 about the shaft 35 corresponds to a switching operation that changes temperature. In the present example, rotation of the operation unit 3 about the shaft 35 in an arrow B1 direction corresponds to a switching operation for increasing by one step and rotation of the operation unit 3 about the shaft 35 in an arrow B2 direction corresponds to a switching operation for decreasing by one step.

As illustrated in FIG. 11, the panel of the operation unit 3 includes the first detector 9 to detect touching of the operation unit 3. The first detector 9 may include, for example, a capacitive sensor 42. In the present example, the first detector 9 is a capacitive touch sensor (touchpad) arranged on the panel in the elongated direction. The selected icons 31 displayed on the monitor 30 are switched when the first detector 9 detects operation of the panel of the operation unit 3 with a finger or the like.

Figure 12:
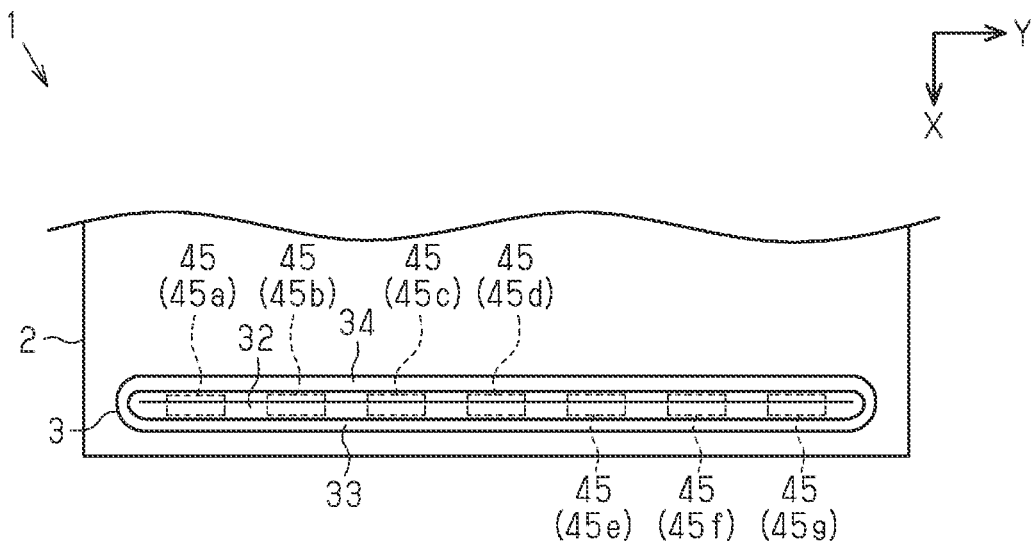
FIG. 12 is a plan view of the operation unit.

As illustrated in FIGS. 12 and 13, operation buttons 11 (hereafter referred to as touch switches 45) are arranged on the panel of the operation unit 3 in correspondence with operation portions (coordinates on touch sensor) where touching is performed. That is, various touch switches 45, which serve as functionalities that are operable with the operation device 1, are arranged on the panel of the operation unit 3. In this manner, with the operation device 1 of the present example, touching of the touch switches 45 is assigned to an operation for selecting functionalities. In the present example, the touch switches 45 include, from the left in FIGS. 12 and 13, a touch switch 45a for defogging the windshield, a touch switch 45b for defogging the back door glass, a touch switch 45c for selecting the air conditioning temperature, a touch switch 45d for selecting an air conditioning mode, a touch switch 45e for selecting air flow, a touch switch 45f for switching on or off a cooling function (dehumidification function), and a touch switch 45g for switching between air recirculation and fresh air.

Rotation of the operation unit 3 about the shaft 35 corresponds to an operation that determines the functionality selected with the operation buttons 45. In the present example, operations of the touch switches 45a, 45b, 45f, and 45g of the touch switches 45 about the shaft 35 in the arrow B1 direction correspond to determination operations. Further, operations of the touch switches 45a to 45g of the touch switches 45 about the shaft 35 in the arrow B1 direction correspond to downward determination operations by one step and operations in the arrow B2 direction correspond to upward determination operations by one step.

The operation of the operation device 1 in the present embodiment will now be described with reference to FIGS. 15 and 16.

Figure 15:
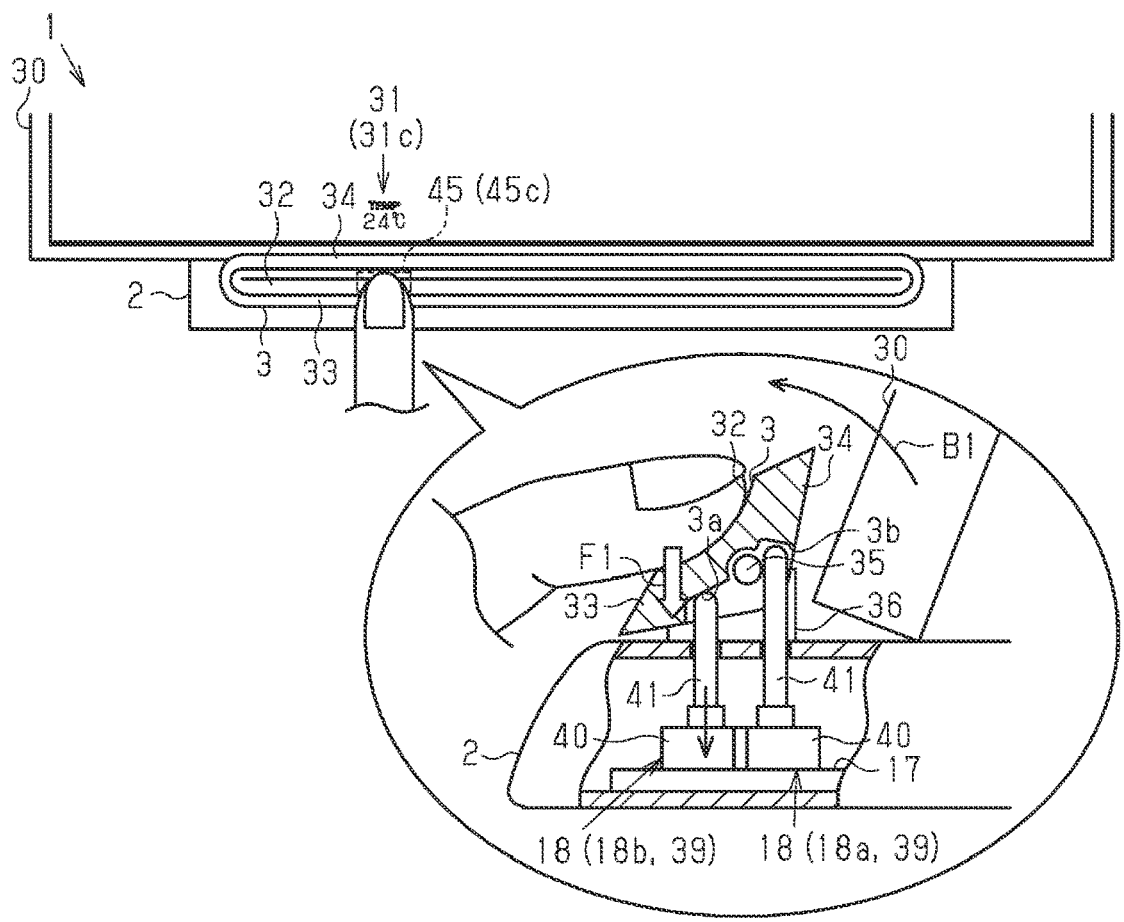
FIG. 15 is a diagram illustrating the operation unit when operated in a first direction.

In FIG. 15, the air conditioning temperature is set to 24° C., and the monitor 30 displays "TEMP 24° C." To adjust the air conditioning temperature with the operation device 1, the user touches the touch switch 45c for selecting the air conditioning temperature on the operation unit 3. That is, the user places his or her finger on the touch switch 45c of the operation unit 3 for selecting the air conditioning temperature. In this case, the icon 31c for air conditioning temperature on the display unit 6 may change its color or enlarge its image size to indicate the selected state to the operator.

To lower the air conditioning temperature of the passenger compartment, the user uses his or finger to touch the touch switch 45c, which selects the air conditioning temperature, to apply an operation load to the operation unit 3 in the first direction F1 to rotate the operation unit 3 about shaft 35 in the arrow B1 direction. When the operation unit 3 is rotated about the shaft 35 in the arrow B1 direction, an abutment surface 3a on the second side of the operation unit 3 lowers the push rod 41 of the second detector 18b to switch on the contact point inside the switch body 40 of the second detector 18b. Thus, the second detector 18b detects the rotation of the operation unit 3 in the arrow B1 direction.

In this manner, touching of the touch switch 45c for selecting the air conditioning temperature corresponds to an operation performed to select changing of the temperature, and downward pushing of the operation unit 3 in this state about the shaft 35 in the arrow B1 direction corresponds to a determination operation. The operation of the operation unit 3 about the shaft 35 in the arrow B1 direction is detected by the second detector 18b on the base 17.

When the first detector 9 detects touching of the touch switch 45c for selecting the air conditioning temperature and the second detector 18b detects rotation of the operation unit 3 about the shaft 35 in the arrow B1 direction, the controller 20 outputs an operation signal St indicating such a situation to the air conditioner. This lowers the selected air conditioning temperature by one step from the current state.

The controller 20 also changes the display of the current air conditioning on the monitor 30 to the changed temperature. Specifically, in a case where a determination operation is performed once with the operation unit 3 in the arrow B1 direction to lower the set temperature by 1° C., when the operation unit 3 detects that an operation to lower the temperature is performed one time during which the currently set temperature is 24° C., the controller 20 changes the display of the monitor 30 from 24° C. to 23° C. by lowering the currently set temperature by 1° C.

Figure 16:
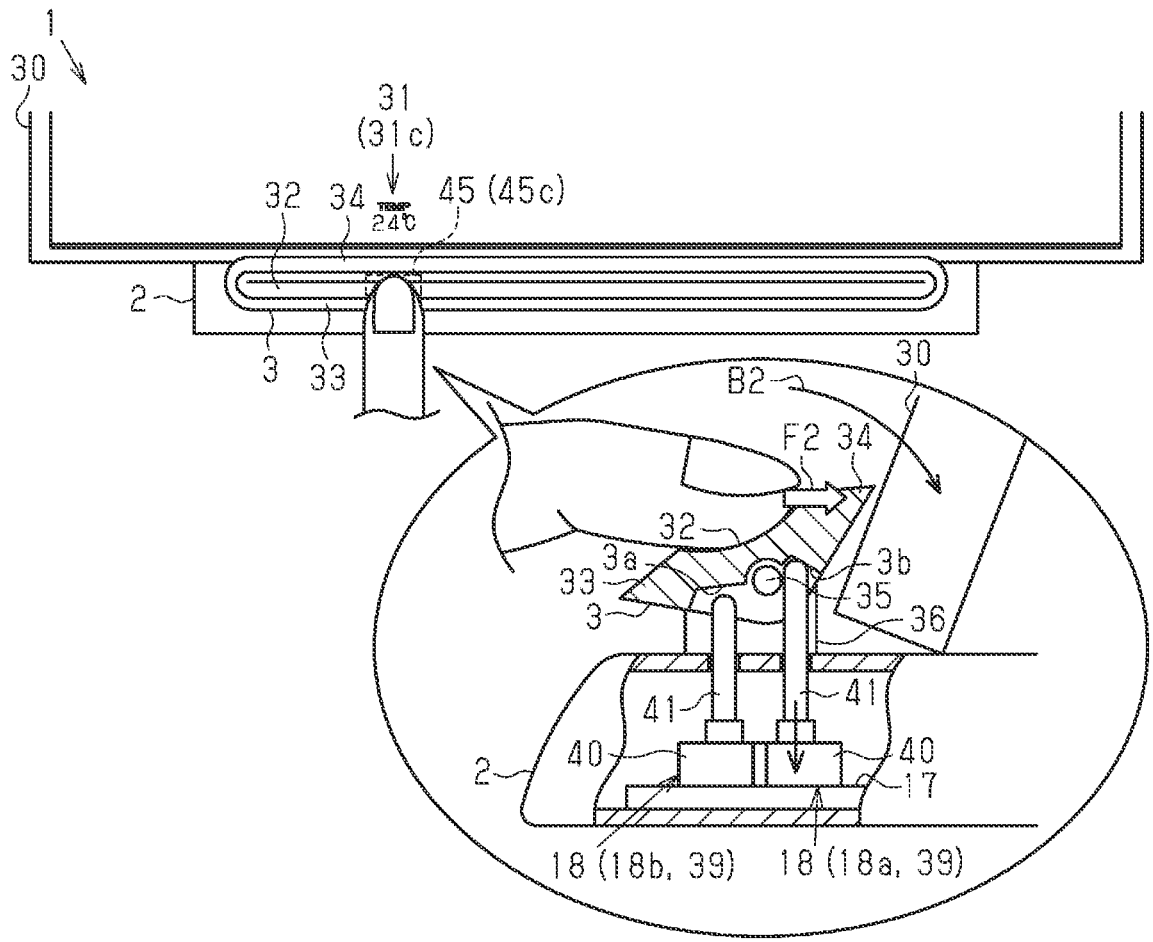
FIG. 16 is a diagram illustrating the operation unit when operated in a second direction.

As illustrated in FIG. 16, to raise the air conditioning temperature of the passenger compartment, the user touches the touch switch 45c for selecting the air conditioning temperature and applies an operation load to the operation unit 3 in second direction F2 to rotate the operation unit 3 about shaft 35 in the arrow B2 direction. When the operation unit 3 is rotated about the shaft 35 in the arrow B2 direction, an abutment surface 3b on the second side of the operation unit 3 lowers the push rod 41 of the second detector 18a to switch on the contact point inside the switch body 40 of the second detector 18a. Thus, the rotation of the operation unit 3 in the arrow B2 direction is detected by the second detector 18a.

In this manner, touching of the touch switch 45c for selecting the air conditioning temperature corresponds to an operation for selecting temperature changing, and the operation in which the operation unit 3 in this operation state is pushed downward about the shaft 35 in the arrow B2 direction is corresponds to a determination operation. The operation of the operation unit 3 about the shaft 35 in the arrow B2 direction is detected by the second detector 18a on the base 17.

When the first detector 9 detects touching of the touch switch 45c for selecting the air conditioning temperature and the second detector 18a detects rotation of the operation unit 3 about the shaft 35 in the arrow B2 direction, the controller 20 outputs an operation signal St indicating such a situation to the air conditioner. This raises the selected air conditioning temperature by one step from the current state.

The controller 20 also changes the display of the current air conditioning on the monitor 30 to the changed temperature. Specifically, in a case where a determination operation is performed once with the operation unit 3 in the arrow B2 direction to raise the set temperature by 1° C., when the operation unit 3 detects that an operation to raise the temperature is performed one time during which the currently set temperature is 24° C., the controller 20 changes the display of the monitor 30 from 24° C. to 25° C. by raising the currently set temperature by 1° C.

The operation device 1 in the above embodiment has the following advantages.

(9) The operation unit 3 includes the finger resting portion 32, the first push portion 33, and the second push portion 34. The finger resting portion 32 of the operation unit 3 is recessed in conformance with the finger of the operator. The first push portion 33 is defined by the arrangement of the finger resting portion 32 on the operation unit 3, and the first push portion 33 is configured to be pressed by the user using the finger to operate the operation unit 3 in the first direction F1. The second push portion 34 is defined by the arrangement of the finger resting portion 32 on the operation unit 3, and the second push portion 34 is configured to be pressed by the user using the finger to operate the operation unit 3 in the second direction F2. With this structure, the user pushes the first push portion 33 to operate the operation unit 3 in the first direction F1, and the user pushes the second push portion 34 to operate the operation unit 3 in the second direction F2. In this manner, the operation unit 3 is formed to facilitate operation.

(10) The operation unit 3 is configured to be rotatable about the shaft 35 extending in the direction that intersects the first direction F1 and the second direction F2. The operation unit 3 rotates in one direction, namely, the first direction F1, about the shaft 35 and rotates in the other direction, namely, the second direction F2, about the shaft 35. In this case, the operation unit 3 has a simple structure that rotates about the shaft 35.

The present embodiment may be modified as follows. The present embodiment and the following modifications may be combined as long as the combined modifications remain technically consistent with each other.

Structure of Operation Device 1

Figure 17:
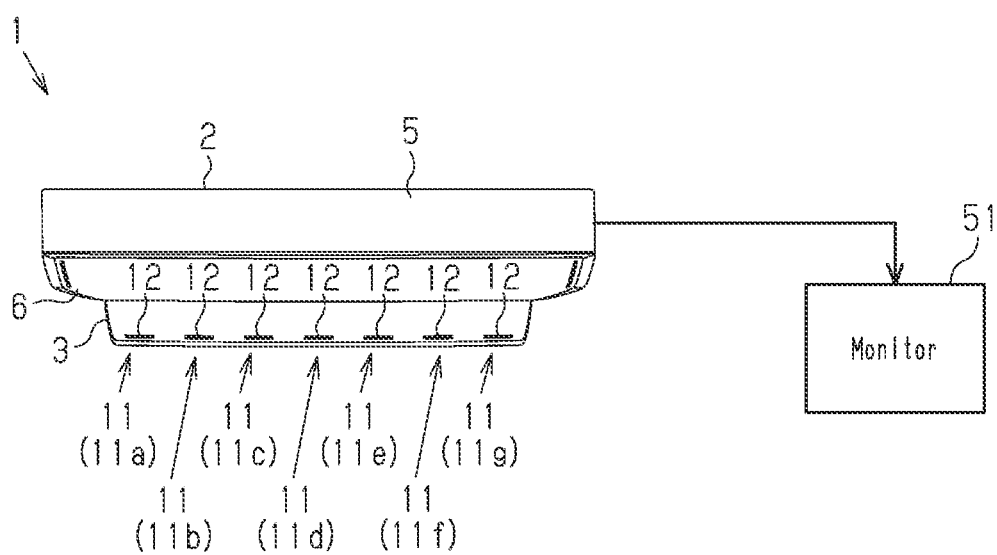
FIG. 17 is a diagram illustrating a modified example of the operation device.

In each embodiment, as illustrated in FIG. 17, the operation device 1 may be connected to a monitor 51 that is separate from the device body 2, and the monitor 51 may display the current state selected through operation of the operation unit 3. Examples of the monitor 51 include the screen of an onboard car navigation system and a heads-up display reflected on the windshield. In this case, selection of the current operation is easily recognized from the display state of the monitor 51 arranged separately from the operation device 1.

Operation Unit 3

In each embodiment, the operation unit 3 does not need to be movable vertically by one step from the neutral position. Instead, the operation unit 3 may be movable vertically by a number of steps.

In each embodiment, the operation unit 3 does not need to be moveable in both upper and lower directions from the neutral position. Instead, the operation unit 3 may be operable only in one of the upward direction and the downward direction.

In each embodiment, the operation unit 3 does not need to include a plate-like member. Instead, the operation unit 3 may have a different shape such as a cylindrical shape, a block shape, or the like.

In each embodiment, the operation unit 3 does not need to be of a paddle type as in the example. Instead, the operation unit 3 may be of a sliding type movable back and forth linearly or a rotational operation type that turns a knob.

In each embodiment, the operation buttons 11 with different functionalities (such as air conditioner and audio device) may be arranged on the same operation unit 3.

In each embodiment, the operation unit 3 does not need to be of a momentary type. Instead, the operation unit 3 may maintain the position.

Operation Button 11

In each embodiment, the operation buttons 11 do not need to be arranged in a line. Instead, the operation buttons 11 may be arranged at random.

In each embodiment, the operation buttons 11 may be arranged on only one of the first side and second side of the operation unit 3.

In each embodiment, the marks 13 associated with the operation button 11 do not need to be printed matter. Instead, the first side of the operation unit 3 may include a display panel to represent the marks 13 by rendering images on the panel.

In each embodiment, the operation unit 3 does not need to include the marks 13 for the corresponding operation buttons 11. Instead, the marks 13 may be omitted.

First Detector 9 and Second Detector 18

In each embodiment, the first detector 9 does not need to be arranged along all of the operation buttons 11. Instead, the first detectors 9 may be arranged in correspondence with each operation button 11.

In each embodiment, the first detector 9 may detect touching of both the first side and the second side with the same member.

In each embodiment, the first detector 9 does not need to be arranged on a single same plane. When the operation unit 3 is formed to have a step shape with a recess and a projection, the first detector 9 may be arranged on different planes.

In each embodiment, the second detector 18 may include a member other than a tactile switch.

In each embodiment, the second detector 18 does not need to include a switch. Instead, the second detector 18 may include a sensor.

In each embodiment, the second detector 18 may detect upward movement and downward movement of the operation unit 3 with the same member.

Controller 20 and Detection Signals Sk

In each embodiment, the controller 20 does not need to be incorporated into the device body 2. Instead, the controller 20 may be separate from the device body 2.

In each embodiment, a detection signals Sk does not need to be output through a wire. Instead, a detection signals Sk may be output through wireless communication.

Second Embodiment

In the embodiment, the operation unit 3 does not need to rotate about the shaft. Instead, the operation unit 3 may be of a different operation type such as a sliding type that switches states through, for example, a sliding operation.

In the embodiment, the operation unit 3 does not need to be elongated in the device width direction. Instead, the operation unit 3 may be short in, for example, the device width direction.

In the embodiment, the operation unit 3 may be operated in plural steps in each of the first direction F1 and the second direction F2.

In the embodiment, the operation unit 3 does not need to have a substantially L-shaped cross section. Instead, the operation unit 3 may have any shape as long as the operation unit 3 can be operated by a finger on the operation unit 3 in the first direction F1 or the second direction F2.

In the embodiment, the second detector 18 does not need to be the tactile switch 39. Instead, the second detector 18 may include a different mechanical switch. Further, the second detector 18 does not need to include a switch. Instead, the second detector 18 may include a sensor.

In the embodiment, the second detectors 18a and 18b do not need to include members of the same type. Instead, the second detectors 18a and 18b may include members of different types.

In the embodiment, the touch switches 45 may alternately be switched on and off when pressed.

In the embodiment, the touch switches 45 do not need to be arranged in a line in the longitudinal direction of the operation unit 3. Instead, the touch switches 45 may be arranged in, for example, several lines.

In the embodiment, the touch switches 45 may be arranged on the second side of the operation unit 3 in addition to the first side.

In the embodiment, the first detector 9 does not need to be of a capacitive type. Instead, the first detector 9 may be of, for example, a resistive film type.

In the embodiment, the first direction F1 and the second direction F2 do not need to be orthogonal to each other. Instead, the first direction F1 and the second direction F2 may be any directions as long as the first direction F1 and the second direction F2 intersect each other.

In each embodiment, the operation device 1 does not need to include the monitor 30.

Others

In each embodiment, the operation signal St does not need to be a signal indicative of which operation button 11 is operated. For example, when the operation device 1 recognizes the current operation, the operation signal St may be used to instruct the operation that is to be performed by the apparatus 4.

In each embodiment, the operation device 1 may be used for an apparatus or a device outside a vehicle.

The present disclosure includes the following embodiments.

Embodiment 1

An operation device, including:
a device body (2);
an operation unit (3) rotatable about a shaft (16;35) arranged on the device body;
a first detector (9) that detects touching of the operation unit;
a second detector (18) that detects rotation of the operation unit (3); and
a controller (20) that generates an operation signal (St) for an operation subject apparatus in accordance with an input to the operation unit (3), where
the controller (20) receives the input as a continuous two-step operation including the touching detected by the first detector (9) and the rotation detected by the second detector (18).

Embodiment 2

The operation device according to embodiment 1, where the first detector (9) includes a touch panel.

Embodiment 3

The operation device according to embodiment 1 or 2, where
the operation unit (3) is rotatable about the shaft (16; 35) in a predetermined rotation range from a reference position in a first direction and a second direction that is opposite to the first direction, and
the second detector (18) includes a first tactile switch that detects rotation of the operation unit (3) in the first direction and a second tactile switch that detects rotation of the operation unit (3) in the second direction.

Embodiment 4

The operation device according to any one of embodiments 1 to 3, where
the operation unit (3) includes a set of a first touch-sensitive operation button (11a to 11g) arranged on a first side of the operation unit and a second touch-sensitive operation button (11h to 11j) arranged on a second side of the operation unit, and
the set of the first and second touch-sensitive operation buttons is associated with an operation for changing a set value of one of a plurality of functionalities of the operation subject apparatus or an operation for switching on or off the one of the plurality of functionalities.

The invention claimed is:

1. An operation device, comprising:
an operation switch configured to be movable relative to a device body;
a first detector that detects touching of the operation switch;
a second detector that detects movement of the operation switch relative to the device body; and
a controller that processes detection signals of the first detector and the second detector so that the movement of the operation switch relative to the device body and the touching of the operation switch correspond to inputs for operating an operation subject apparatus,
wherein the operation switch includes:
a finger resting portion recessed in conformance with a finger of an operator;
a first push portion defined by arrangement of the finger resting portion, the first push portion being configured to be pressed with a finger to move the operation switch relative to the device body in a first direction; and
a second push portion defined by arrangement of the finger resting portion, the second push portion being configured to be pressed with a finger to move the operation switch relative to the device body in a second direction.

2. The operation device according to claim 1, wherein touch-sensitive operation buttons assigned to plural portions of the operation switch are arranged on the operation switch in a longitudinal direction of the operation switch.

3. The operation device according to claim 1, wherein the operation switch is movable by one step in each of two directions from a neutral position.

4. The operation device according to claim 1, wherein the first detector is arranged on both of a first side and a second side of the operation switch.

5. The operation device according to claim 1, further comprising marks for touch-sensitive operation buttons assigned to plural portions of the operation switch.

6. The operation device according to claim 1, wherein the operation device is connected to a monitor that is separate from the device body, and the monitor displays a current state selected through operation of the operation switch.

7. The operation device according to claim 1, wherein the operation switch is configured to be rotatable about a shaft extending in a direction that intersects the first direction and the second direction, the first direction being one direction around the shaft and the second direction being the other direction around the shaft.

* * * * *